United States Patent
Zheng et al.

(10) Patent No.: US 7,928,533 B2
(45) Date of Patent: Apr. 19, 2011

(54) NANO-MULTIPLICATION REGION AVALANCHE PHOTODIODES AND ARRAYS

(75) Inventors: Xinyu Zheng, Monterey Park, CA (US); Bedabrata Pain, Los Angeles, CA (US); Thomas J. Cunningham, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 336 days.

(21) Appl. No.: 12/191,843

(22) Filed: Aug. 14, 2008

(65) Prior Publication Data

US 2009/0152681 A1    Jun. 18, 2009

Related U.S. Application Data

(60) Provisional application No. 60/964,645, filed on Aug. 14, 2007.

(51) Int. Cl.
*H01L 29/66* (2006.01)

(52) U.S. Cl. ........ 257/551; 257/186; 257/199; 257/481; 257/603; 257/E21.357

(58) Field of Classification Search .............. 257/79, 257/107, 186, 199, 481, 482, 551, 603–606
See application file for complete search history.

(56) References Cited

U.S. PATENT DOCUMENTS

| 7,078,739 | B1 * | 7/2006 | Nemati et al. | ............. 257/107 |
| 2002/0070384 | A1 * | 6/2002 | Clark et al. | ................ 257/79 |

OTHER PUBLICATIONS

Campbell J.C., et al., Recent Advances in Avalanche Photodiodes, IEEE Journal of Selected Topics in Quantum Electronics, 2004, 10: 777-787.
Jackson, J.C., et al., A Novel Silicon Geiger-mode Avalanche Photodiode, IEEE, 2002, 797-800.
Rochas, J.P., et al., Low Noise Silicon Avalanche Photodiodes Fabricated in Conventional CMOS Technologies, IEEE Transaction on Electronic Devices, 2002, 49: 387-394.
Bergamini, P., et al., An Imaging Photon Counting Intensified CCD for High Speed Photometry, Experimental Astronomy, 2000, 10: 457-471.
Sun, X., et al., Photon Counting with Silicon Avalanche Photodiode, Journal of Lightwave Technology, 1992, 10: 1023-1032.
Zheng, X., et al., New Process and Pixel Structure of an SOI-CMOS Imager, IEEE, 2003, 101-102.
Brown, R.G.W., et al., Characterization of Silicon Avalanche Photodiodes for Photon Correlation Measurements 1: Passive Quenching, Applied Optics, 1986, 25: 4122-4126.
Cova, S., et al., Avalanche Photodiodes and Quenching Circuits for Single-photon Detection, Applied Optics, 1996, 35:1956-1976.

(Continued)

*Primary Examiner* — Evan Pert
*Assistant Examiner* — Scott Wilson
(74) *Attorney, Agent, or Firm* — Steinfl & Bruno LLP

(57) ABSTRACT

An avalanche photodiode with a nano-scale reach-through structure comprising n-doped and p-doped regions, formed on a silicon island on an insulator, so that the avalanche photodiode may be electrically isolated from other circuitry on other silicon islands on the same silicon chip as the avalanche photodiode. For some embodiments, multiplied holes generated by an avalanche reduces the electric field in the depletion region of the n-doped and p-doped regions to bring about self-quenching of the avalanche photodiode. Other embodiments are described and claimed.

14 Claims, 5 Drawing Sheets

OTHER PUBLICATIONS

Brown, R.G.W., et al., Characterization of Silicon Avalanche Photodiodes for Photon Correlation Measurements 2: Active Quenching, Applied Optics, 1987, 12: 2383-2389.

Zappa, F., et al., Monolithic Active-quenching and Active-rest Circuit for Single-photon Avalanche Detectors, IEEE Journal of Solid State Circuits, 2003, 38: 1298-1301.

Rochas G., et al. First Passively-quenched Single Photon Counting Avalanche Photodiode Element Integrated in a Conventional CMOS Process with 32ns Dead Time, Proceedings of SPIE, 2002, 4583: 107-115.

Rochas, M., et al., First Fully Integrated 2-D Array of Single-photon Detectors in Standard CMOS Technology, IEEE, 2003, 15: 963-965.

Mmoszynki, M., et al., Comparative Study of Avalanche Photodiodes with Different Structures Scintillation Detection, IEEE Transactions on Nuclear Science, 2001, 48: 1205-1210.

Budianu, E., et al., Optimization of Absorption and Multiplication Layers Characteristics for High Performances Avalanche Photodiodes on Silicon and InGAAs/InP Heterostructures, IEEE, 1998, 2: 519-522.

Kindt, W.J., et al., Modeling and Fabrication of Geiger Mode Avalanche Photodiodes, IEEE Transactions on Nuclear Science, 1998, 2: 715-719.

Straubmeier, et al., Optima: A Photon Counting High-speed Photometer, Experimental Astronomy, 2001, 11: 157-170.

* cited by examiner

NANO-MULTIPLICATION REGION AVALANCHE PHOTODIODES AND ARRAYS

PRIORITY CLAIM

This application claims the benefit of U.S. Provisional Application No. 60/964,645, filed 14 Aug. 2007.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to imaging arrays and avalanche photodiodes.

BACKGROUND

Avalanche photodiodes are used in imaging arrays, where each pixel in an imaging array comprises an avalanche photodiode and associated circuitry. In many applications, it may be desirable for an imaging array to exhibit little cross-talk between pixels, to be easily manufactured, to have relatively high quantum efficiency, and to have low dark current. It may also be desirable to provide fast quenching of the avalanche current.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
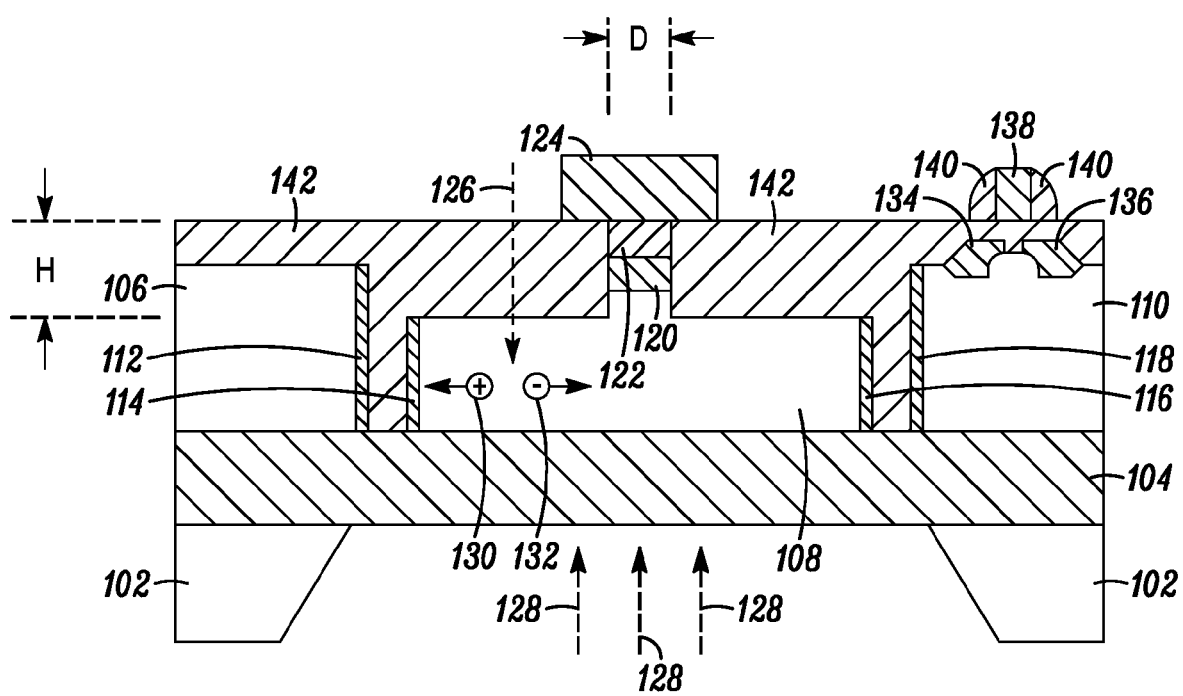
FIG. 1 illustrates a cross sectional view of an imaging pixel and avalanche photodiode with associated circuitry according to an embodiment.

FIG. 1 illustrates a simplified cross sectional view or slice of an imaging pixel and avalanche photodiode according to an embodiment. For ease of illustration, the various components illustrated in FIG. 1 are not drawn to scale. The components illustrated in FIG. 1 are formed on a wafer. For some embodiments, portions of this wafer may be removed, where remaining portions of the wafer are indicated by numeric label 102. Formed on the wafer is buried insulator layer 104, which may be silicon dioxide, for example. Regions 106, 108, and 110 represent intrinsic silicon. The sides of these intrinsic silicon semiconductor regions are doped to form p+ regions, labeled 112, 114, 116, and 118 in FIG. 1. Regions 114 and 116 serve as an anode for the avalanche photodiode, and regions 112 and 118 serve as guard layers for other circuit components that may be integrated on the same wafer.

Region 120 is p-doped silicon, and region 122 is heavily n-doped silicon. p-region 120 introduces a high potential gradient, leading to a relatively thin multiplication region, and n-region 122 is the cathode for the avalanche photodiode. Polysilicon cap (or pad) 124 is a thin n+ region to help protect cathode n-region 122 from erosion during metal silicon alloying. Under usual operation, the avalanche diode is reverse biased, so that cathode 122 is held at a higher potential than anode regions 114 and 116.

Dashed arrow 126 pictorially illustrates front illumination of the avalanche photodiode, whereas dashed arrows 128 illustrate back illumination. Electron-hole pair generation due to an absorbed photon occurs in intrinsic silicon region 108, as pictorially represented by hole 130 and electron 132. As electrons are swept through the depleted regions within active regions 120 and 122, the relatively high electric field contributes to avalanche generation of more electron-hole pairs.

In practice, embodiments may comprise a plurality of regions of the type illustrated by region 108, where each region includes n and p doped layers (e.g., 122 and 120) forming an avalanche photodiode; and embodiments may comprise a plurality of regions of the type illustrated by regions 106 and 110 for forming circuits to support the avalanche photodiodes. As a result, an embodiment may include an array of such avalanche photodiodes and supporting circuitry.

A region of the type 108 may be viewed as a first type of silicon island, used for providing avalanche photodiodes; and a region of the type 106 or 110 may be viewed as a second type of silicon island, used for providing circuits in support of the avalanche photodiodes. For example, formed on silicon island 110 is a MOSFET (Metal-Oxide-Semiconductor-Field-Effect-Transistor) comprising doped regions 134 and 136 to form a source and a drain, and polysilicon region 138 to form a gate. Next to gate 138 is insulator material 140, which may be silicon dioxide, for example, which are sometimes referred to as sidewall spacers when used as a mask for forming LDD (Lightly Doped Drain) devices.

The silicon islands are insulated from each other by insulator layer 142, which may be silicon dioxide, for example. This results in a silicon-on-insulator (SOI) structure for an embodiment, which is expected to help mitigate crosstalk between photo pixels in an embodiment comprising an array of avalanche photodiodes and associated circuitry. Isolation of the silicon islands allows for a pixel to detect ultra-low light while its neighboring pixels may be illuminated by strong light. Also, it is expected that blooming photo-carriers generated in one pixel should not invade into its neighboring pixels as may be the case in some prior art imagers. Additional passivation layers may be formed on top of the structures indicated in FIG. 1, as well as other layers comprising interconnects, but for ease of illustration such additional layers are not shown.

For some embodiments, a typical thickness for a silicon island may be in a range of 5 to 10μ, but other embodiments may utilize silicon islands with different thicknesses, such as for example a thickness of up to 200μ or more. For some embodiments, the active regions making up an avalanche photodiode may be centered about their respective silicon island (e.g. 108). For some embodiments, a typical diameter for the structure comprising p-region 120 and n-region 124 may be about 0.1μ, where this dimension is denoted by "D" in FIG. 1; and a typical height of the resulting structure (which includes some of intrinsic silicon region 108) may be about 0.5 to 1.0μ, where this dimension is denoted by "H" in FIG. 1. For some embodiments, the doping concentration of p-doped layers 112, 114, 116, and 118 may be about $1*10^{19}$ $cm^3$, with a thickness of about 0.1 to 0.2μ.

With buried oxide layer 104 substantially planar, the linear dimension along the direction indicated by "D" may be thought of as a linear dimension parallel to the plane defined by buried oxide layer 104, whereas the linear dimension along the direction indicated by "H" may be thought of as being perpendicular to the linear dimension indicated by "D". Stated more colloquially, "D" denotes a linear dimension in the horizontal direction, and "H" denotes a linear dimension in the vertical direction.

Embodiments are expected to have relatively high quantum efficiency and fill factor, leading to a relatively high sensitivity. For front illuminated embodiments, with a pixel pitch of 10μ, a fill factor of between 60% to 70% should be achievable with today's state-of-the-art technology. This relatively high fill factor value is partially due to the relatively small cathode size, as well as the elimination of circuitry that would otherwise be needed for quenching. For back illumination, the fill factor may be between 90% to 95% with today's state-of-the art technology.

With the nano-scale dimensions for regions 120 and 122, there is a separation of the avalanching structure (the depletion region formed by regions 120 and 122) from the photon absorption region (e.g., 108). This allows for a larger absorption thickness to increase quantum efficiency.

Regarding the latter issue, embodiments are expected to have what may be described as a self-quenching capability. This self-quenching capability comes about because of the nano-scale dimensions structure of an embodiment avalanche photodiode. Because of the relatively small volume of the reach-through structure provided by region 120, the multiplying holes generated in an avalanche is expected to significantly reduce the electric field generated by the depletion region in regions 120 and 122, thereby mitigating the avalanche. Simulation experiments have shown that for some embodiments, self-quenching may take place in about 10 picoseconds.

Figure 2:
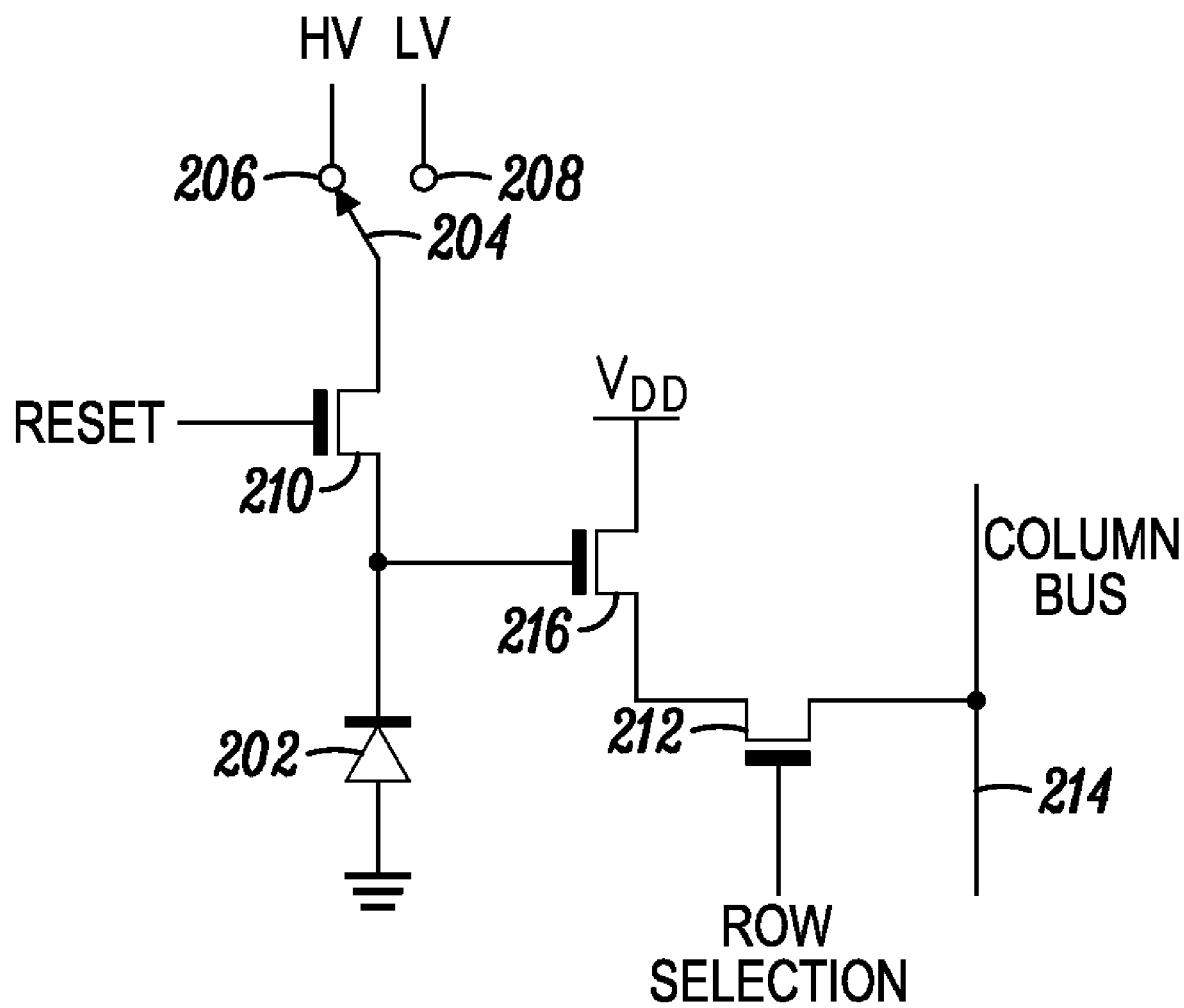
FIG. 2 illustrates an embodiment at a circuit level.

A pixel circuit for an avalanche photodiode according to an embodiment is illustrated in FIG. 2, where an avalanche photodiode is shown as diode 202. As seen in FIG. 2, the pixel circuit is relatively simple because additional circuitry is not needed for quenching due to the self-quenching attribute of avalanche photodiode 202. There are two working states, depending upon the position of switch 204. When switch 204 is connected to node 206, the pixel circuit is configured into what may be termed a high voltage state to perform photon counting. (The voltage at node 206 is higher than the voltage at node 208.) When switch 204 is connected to node 208, the pixel circuit is configured into what may be termed a low voltage state for conventional operation. The voltage at node 208 is lower than the breakdown voltage of avalanche photodiode 202.

Also shown in the circuit of FIG. 2 is reset transistor 210, row selection transistor 212, column bus 214, and transistor 216, the latter serving as a follower or buffer. Components 210, 212, 214, and 216 are standard components used in pixel array circuits. Their operation is well known, and need not be discussed in detail. The pixel circuit may be formed on silicon islands 110 or 106.

A two state pixel circuit, such as illustrated in FIG. 2, allows the pixel to adapt its sensitivity under different illumination levels, which is expected to help embodiments achieve a relatively high dynamic range and high contrast.

Figure 3A:
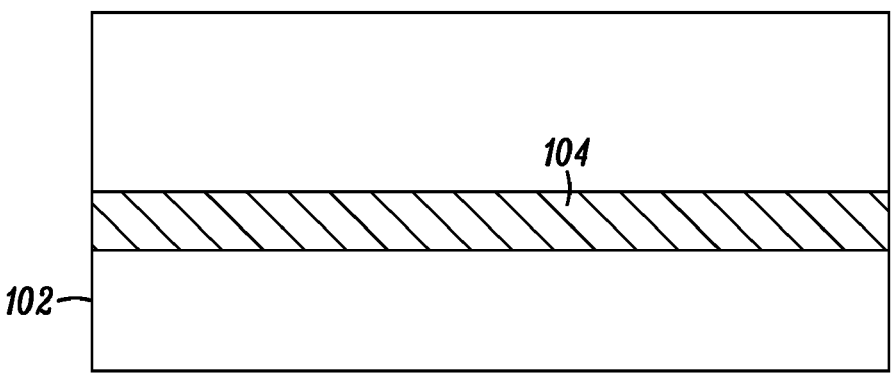
FIGS. 3A through 3I illustrate processing steps according to an embodiment.
Figure 3B:
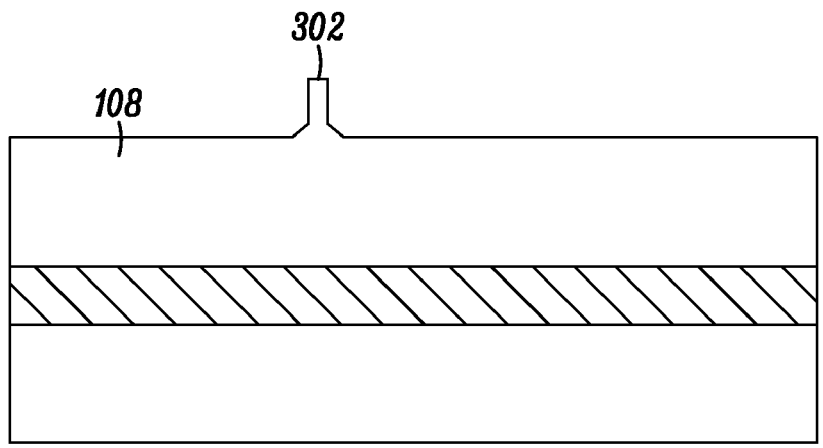
Figure 3C:
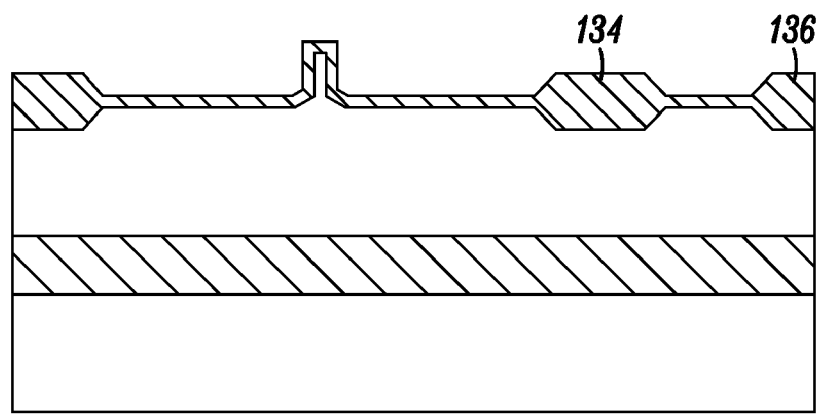
Figure 3D:
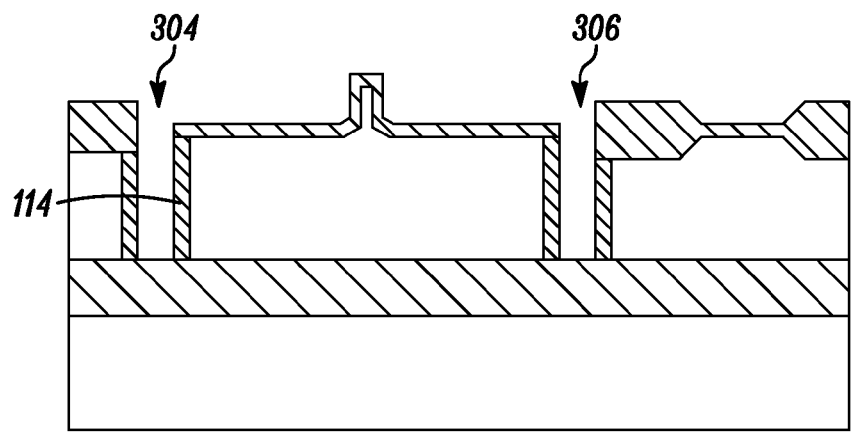
Figure 3E:
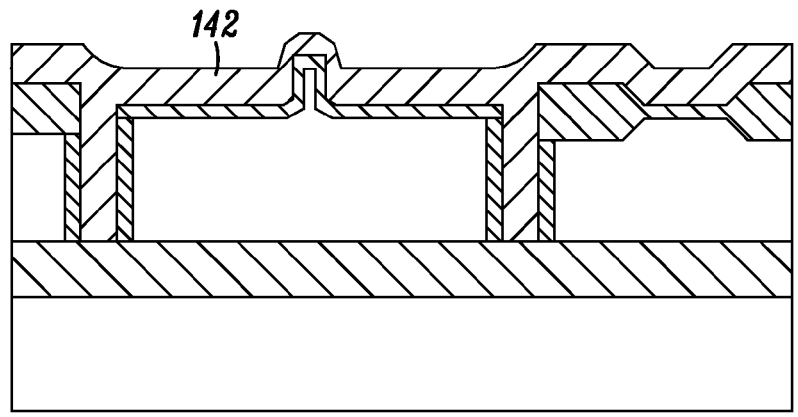
Figure 3F:
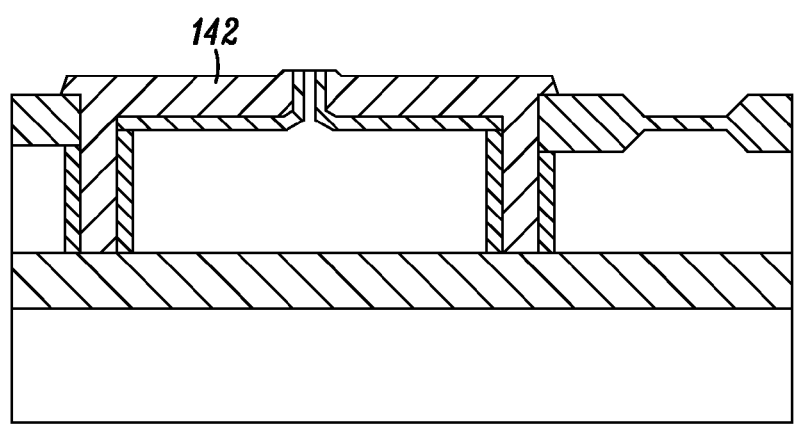
Figure 3G:
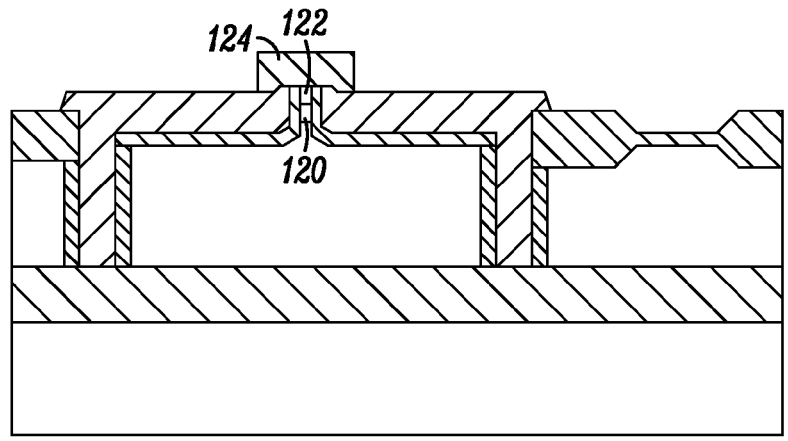
Figure 3H:
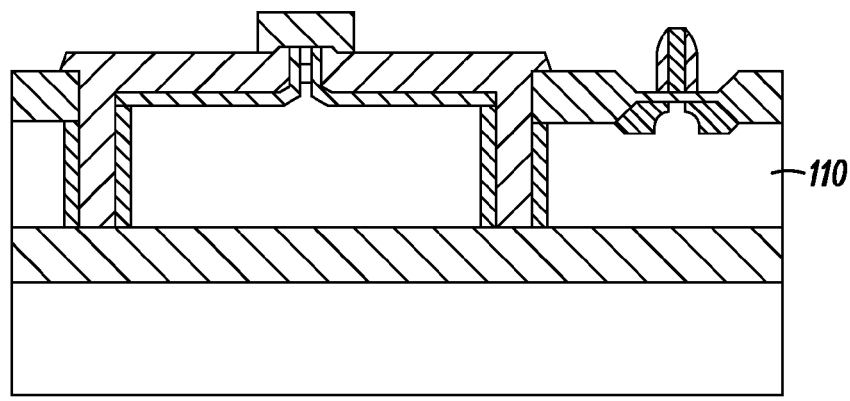
Figure 3I:
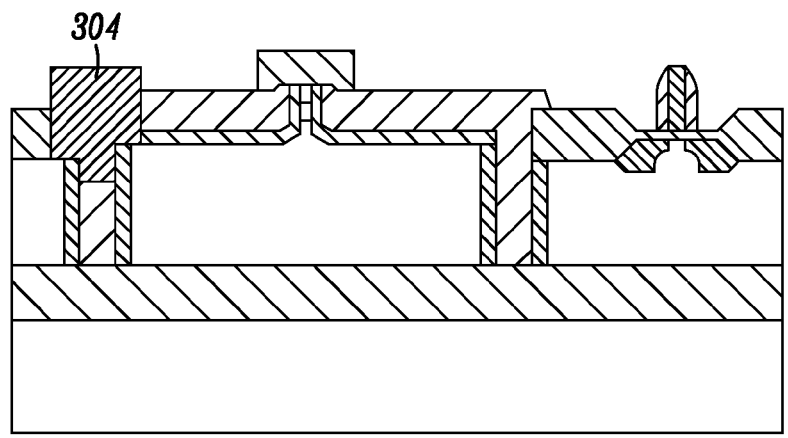

FIGS. 3A through 3I illustrate some of the process steps for fabricating an embodiment, and these figures share some of the same numeric labels used in the embodiment of FIG. 1, but for ease of illustration not all components are labeled in each process step. FIG. 3A illustrates wafer 102 with buried oxide layer 104. In FIG. 3B, nano-pillar 302 is formed in intrinsic silicon 108 using well-known lithography techniques, such as for example electron beam lithography and reactive ion etching. For some embodiments, the diameter of nano-pillar 302 is about 0.1μ, with a height of about 0.5 to 1.0μ. (These dimensions are given only to provide an example, but other embodiments may have different sized components.) FIG. 3C illustrates surface oxidation and field oxide formation to provide field oxide 134 and 136. FIG. 3D illustrates deep trenches 304 and 306, which may be formed by using deep reactive ion etching. The anode regions, such as for example 114, may be formed by boron doping on the sidewalls of the silicon islands. Because the top surfaces have been oxidized, the doping occurs on the sidewalls. FIG. 3E illustrates anti-reflectance dielectric material 142, e.g., silicon dioxide. In FIG. 3F, the tip of nano-pillar 302 is exposed by chemical mechanical polishing (CMP). With nano-pillar 302 exposed, in FIG. 3G implantation of boron and arsenic in nano-pillar 302 is used to form p-region 120 and n-region (cathode) 122, respectively, followed by forming polysilicon 124 on top of nano-pillar 302. FIG. 3H illustrates fabrication of a MOSFET on silicon island 110, and FIG. 3I represents metallization layers. In the particular embodiment of FIG. 3I, element 304 is a plug (usually tungsten) used to introduce a lead out for electrical connection.

An embodiment avalanche photodiode on a silicon island, as illustrated in FIG. 1, may be integrated on a silicon chip with other embodiment avalanche photodiodes on other silicon islands to provide an array of imaging pixels, each with supporting circuitry on silicon islands, were each of the silicon islands are electrically isolated from one another, except for intended interconnects among the avalanche photodiodes and supporting circuitry.

Various modifications may be made to the described embodiments without departing from the scope of the invention as claimed below. For example, the dimension denoted by "D" in FIG. 1 was referred to as a diameter, which may imply that nano-pillar 302 in FIG. 3B is cylindrical in shape. However, there is no requirement that nano-pillar 302 be cylindrical in shape. Furthermore, it is to be understood that the term "cylindrical" does not necessarily imply a perfect cylinder, but rather a structure which is relatively cylindrical in shape, depending upon the particular silicon process used to etch a pillar type structure. For example, for some processing techniques, the shape of nano-pillar 302 may be somewhat random in nature, and may only approximate a cylinder. Accordingly, the dimension denoted by "D" may be considered a linear dimension, but not necessarily a diameter.

What is claimed is:
1. An article of manufacture comprising:
a first insulator region, the first insulator region substantially planar; and
a first silicon island formed on the first insulator region and having a first linear dimension substantially parallel to the first insulator region and a second linear dimension substantially perpendicular to the first linear dimension of the first silicon island, the first silicon island having a pillar formed on the first island, the pillar having a first linear dimension substantially parallel to the first insulator region and a second linear dimension substantially perpendicular to the first linear dimension of the pillar, wherein the first and second linear dimensions of the pillar are substantially less than the first and second linear dimensions of the first silicon island, the pillar comprising a p-doped silicon region and an n-doped silicon region, wherein the first insulator region is closer to the p-doped silicon region than to the n-doped silicon region and the first linear dimension of the pillar is not greater than 0.1 microns.

2. The article manufacture as set forth in claim 1, wherein the second linear dimension of the pillar is not greater than 1 micron.

3. The article of manufacture as set forth in claim 1, the first insulator region comprising silicon dioxide.

4. The article of manufacture as set forth in claim 1, the first silicon island comprising p-doped sidewalls.

5. An article of manufacture comprising:
a first insulator region, the first insulator region substantially planar;
a first silicon island formed on the first insulator region and having a first linear dimension substantially parallel to the first insulator region and a second linear dimension substantially perpendicular to the first linear dimension of the first silicon island, the first silicon island having a pillar formed on the first island, the pillar having a first linear dimension substantially parallel to the first insulator region and a second linear dimension substantially perpendicular to the first linear dimension of the pillar, wherein the first and second linear dimensions of the pillar are substantially less than the first and second linear dimensions of the first silicon island, the pillar comprising a p-doped silicon region and an n-doped silicon region, wherein the first insulator region is closer to the p-doped silicon region than to the n-doped silicon region and the first silicon island comprises p-doped sidewalls;
a second silicon island comprising p-doped sidewalls; and
a second insulator region adjacent to the p-doped sidewalls of the first and second silicon islands, and formed on at least a portion of the first and second silicon islands to electrically isolate the first silicon island from the second silicon island.

6. The article of manufacture as set forth in claim 5, the second silicon island comprising a transistor.

7. The article manufacture as set forth in claim 5, the first insulator region and the second insulator region comprising silicon dioxide.

8. The article of manufacture as set forth in claim 5, wherein the first linear dimension of the pillar is not greater than 0.1 microns.

9. The article of manufacture as set forth in claim 8, wherein the second linear dimension of the pillar is not greater than 1 micron.

10. An article of manufacture comprising:
a first insulator region, the first insulator region substantially planar; and
a first silicon island formed on the first insulator region and having a first linear dimension substantially parallel to the first insulator region and a second linear dimension substantially perpendicular to the first linear dimension of the first silicon island, the first silicon island having a pillar formed on the first island, the pillar having a first linear dimension substantially parallel to the first insulator region and a second linear dimension substantially perpendicular to the first linear dimension of the pillar, wherein the first and second linear dimensions of the pillar are substantially less than the first and second linear dimensions of the first silicon island, the pillar comprising a p-doped silicon region and an n-doped silicon region, wherein:
the first insulator region is closer to the p-doped silicon region than to the n-doped silicon region, and
the n-doped silicon region and the p-doped silicon region form a depletion region having an electric field, wherein multiplied holes generated in the n-doped silicon region and the p-doped silicon region during an avalanche reduce the electric field so as to automatically cease the avalanche.

11. The article of manufacture as set forth in claim 10, wherein the multiplied holes reduce the electric field to cease the avalanche within about 10 picoseconds.

12. An article of manufacture comprising:
a first insulator region, the first insulator region substantially planar;
a first silicon island formed on the first insulator region and having a first linear dimension substantially parallel to the first insulator region and a second linear dimension substantially perpendicular to the first linear dimension of the first silicon island, the first silicon island having a pillar formed on the first island, the pillar having a first linear dimension substantially parallel to the first insulator region and a second linear dimension substantially perpendicular to the first linear dimension of the pillar, wherein the first and second linear dimensions of the pillar are substantially less than the first and second linear dimensions of the first silicon island, the pillar comprising a p-doped silicon region and an n-doped silicon region; wherein the first insulator region is closer to the p-doped silicon region than to the n-doped silicon region; and
a polysilicon n-doped cap formed on the n-doped silicon region.

13. The article of manufacture as set forth in claim 12, further comprising:
a reset transistor connected to the polysilicon n-doped cap;
a follower transistor having a gate connected to n-doped silicon region; and
a row selection transistor connected to the follower transistor.

14. The article of manufacture as set forth in claim 13, further comprising:
a second silicon island comprising p-doped sidewalls, where the reset transistor, the follower transistor, and the row selection transistor are formed on the second silicon island; and
a second insulator region adjacent to the p-doped sidewalls of the first and second silicon islands, and formed on at least a portion of the first and second silicon islands to electrically isolate the first silicon island from the second silicon island.

* * * * *